(12) United States Patent
Regimbal et al.

(10) Patent No.: US 8,305,756 B2
(45) Date of Patent: Nov. 6, 2012

(54) SPRING-LOADED DOORS TO PREVENT AIR RECIRCULATION WITHOUT NEED FOR ADDITIONAL SPACE

(75) Inventors: Laurent A. Regimbal, Round Rock, TX (US); Karl Isaac Hamand, Round Rock, TX (US); Lawrence Kyle, Salado, TX (US)

(73) Assignee: Dell Products L.P., Round Rock, TX (US)

( * ) Notice: Subject to any disclaimer, the term of this patent is extended or adjusted under 35 U.S.C. 154(b) by 80 days.

(21) Appl. No.: 12/245,348

(22) Filed: Oct. 3, 2008

(65) Prior Publication Data

US 2010/0087956 A1 Apr. 8, 2010

(51) Int. Cl.
*H05K 7/20* (2006.01)

(52) U.S. Cl. .................. 361/695; 361/716; 454/184

(58) Field of Classification Search .................. None
See application file for complete search history.

(56) References Cited

U.S. PATENT DOCUMENTS

| | | | |
|---|---|---|---|
| 4,149,027 A | 4/1979 | Asher et al. | 174/52 R |
| 5,067,278 A | 11/1991 | Lyons | 49/463 |
| 5,372,515 A | 12/1994 | Miller et al. | 439/138 |
| 5,793,610 A * | 8/1998 | Schmitt et al. | 361/695 |
| 5,921,862 A | 7/1999 | Ucciardi | 454/353 |
| 6,006,475 A | 12/1999 | Schwantes et al. | 49/341 |
| 6,047,836 A * | 4/2000 | Miles | 211/41.17 |
| 6,072,397 A * | 6/2000 | Ostrowski | 340/588 |
| 6,115,250 A * | 9/2000 | Schmitt | 361/695 |
| 6,151,210 A * | 11/2000 | Cercioglu et al. | 361/690 |
| 6,181,557 B1 * | 1/2001 | Gatti | 361/695 |
| 6,301,108 B1 * | 10/2001 | Stockbridge | 361/688 |
| 6,542,363 B2 * | 4/2003 | White | 361/695 |
| 6,604,799 B2 | 8/2003 | Searby et al. | 312/223.2 |
| 6,688,965 B1 * | 2/2004 | Crippen et al. | 454/184 |
| 6,765,795 B2 | 7/2004 | Modica | 361/695 |
| 6,837,785 B2 * | 1/2005 | Soderlund | 454/184 |
| 7,054,721 B2 * | 5/2006 | Malone et al. | 700/300 |
| 7,068,504 B1 | 6/2006 | Helgenberg et al. | 361/687 |
| 7,139,170 B2 * | 11/2006 | Chikusa et al. | 361/695 |
| 7,244,178 B2 * | 7/2007 | Ueda et al. | 454/184 |
| 7,551,436 B2 * | 6/2009 | Hata et al. | 361/695 |
| 7,571,617 B2 * | 8/2009 | Inoue et al. | 62/157 |
| 7,599,183 B2 * | 10/2009 | Dittus et al. | 361/695 |
| 7,688,593 B2 * | 3/2010 | Byers et al. | 361/721 |
| 7,878,888 B2 * | 2/2011 | Rasmussen et al. | 454/184 |

OTHER PUBLICATIONS

Coxe, K.C.; "Thermal Design of the Dell Poweredge M-Series", Enterprise Thermal Engineering, 13 pages.
Loffink, John; Dell PowerEdge M1000e Modular Enclosure Architecture, Dell Enterprise White Paper, 42 pages, Jan. 2008.
Fenner, Chad; "The Next-Generation, Dell Poweredge M1000e Modular Blade Enclosure", Dell Power Solutions, 4 pages, Feb. 2008.

* cited by examiner

*Primary Examiner* — Boris Chervinsky
(74) *Attorney, Agent, or Firm* — Baker Botts L.L.P.

(57) ABSTRACT

The present disclosure relates, in some embodiments, to modular information handling systems configured to automatically adjust coolant flow upon insertion and/or removal of heat-releasing elements (e.g., blades). A system may comprise, for example, a chassis at least partially defining a cavity, at least one fan in fluid communication with the cavity and operable to move coolant through at least a portion of the cavity, and one or more bays. Each of the one or more bays (a) may be at least partially defined by a bay wall, (b) may be configured to receive a heat-releasing element, and/or (c) may comprise an obturator configured to conditionally block fluid communication between the bay and the chassis cavity, the fan, and/or a coolant, wherein the obturator allows fluid communication when a blade is present in the bay and blocks fluid communication when a blade is absent from the bay. A system may further comprise at least one heat-releasing element positioned in at least one of the one or more bays.

19 Claims, 10 Drawing Sheets

SPRING-LOADED DOORS TO PREVENT AIR RECIRCULATION WITHOUT NEED FOR ADDITIONAL SPACE

TECHNICAL FIELD

The present disclosure relates in general to controlling the temperature of information handling systems, and more particularly to devices, systems, and methods for controlling the temperature of information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may be configured in a modular format with blades to allow a user to customize the system according to the user's needs or desires. Modular information systems may have inefficient cooling systems, for example, where less than all bays are occupied with blades.

Energy efficiency of information handling systems has become an area of considerable interest, for example, in light of rising energy costs and/or environmental concerns. Yet, in some cases, system cooling may consume a significant portion of overall system power. A cooling system may include a fan that directs air toward one or more components (e.g., blades) of an information handling system. However, in a modular information handling system, substantial amounts of energy may be expended communicating ambient air and/or exhaust through unoccupied bays. Although fixed plates may be installed to block air flow through such unoccupied bays, manually installed plates may not afford the user all of the desired and/or required flexibility.

SUMMARY

Accordingly, a need has arisen for improved systems and methods for thermal regulation of modular information handling systems.

In accordance with the teachings of the present disclosure, the disadvantages and problems associated with manually obstructing coolant flow through unoccupied bays have been substantially reduced or eliminated.

The present disclosure relates, according to some embodiments, to systems and methods for thermal regulation of modular information handling systems. For example, a modular information handling system may comprise a plurality of modules or bays, each of which may or may not be occupied by a heat-releasing element. Each bay may further comprise an obturator configured to admit or block coolant from passing through one or more of the bays.

The present disclosure relates, in some embodiments, to modular information handling systems configured to automatically adjust coolant flow upon insertion and/or removal of heat-releasing elements (e.g., blades). A system may comprise, for example, a chassis (e.g., a housing, an enclosure) at least partially defining a cavity, at least one fan in fluid communication with the cavity and operable to move coolant through at least a portion of the cavity, and one or more bays. Each of the one or more bays (a) may be at least partially defined by a bay wall, (b) may be configured to receive a heat-releasing element (e.g., a blade), and/or (c) may comprise an obturator configured to conditionally block fluid communication between the bay and the chassis cavity, the at least one fan, and/or a coolant, wherein the obturator allows fluid communication when a blade is present in the bay and blocks (e.g., partially blocks, substantially blocks, completely blocks) fluid communication when a blade is absent from the bay. A system may further comprise at least one blade positioned in at least one of the one or more bays. In some embodiments, each blade may comprise a processor, a memory communicatively coupled to the processor, and/or a local storage resource communicatively coupled to the processor.

An obturator may comprise, in some embodiments, (a) at least one hinge (e.g., a single hinge and/or a butterfly hinge) attached to the chassis and/or the bay wall and (b) a door attached to the hinge and spanning at least a portion of the bay. An obturator may comprise, in some embodiments, (a) a first hinge attached to the chassis and/or the bay wall, (b) a first door attached to the first hinge and spanning at least portion of the bay, (c) a second hinge attached to the chassis and/or the bay wall, and (d) a second door attached to the second hinge and spanning at least a portion of the bay, according to some embodiments. A door (e.g., the first door and/or the second door) may comprise an edge distal to a hinge e.g., the first hinge and/or the second hinge, respectively). In some embodiments, a first door edge and a second door edge may be operable to contact each other in the absence of a blade. An obturator, according to some embodiments, may comprise a spring configured to apply force tending to close the respective obturator door in the absence of a blade. An obturator may comprise a butterfly hinge and at least two doors, each door rotatably attached to the butterfly hinge, in some embodiments.

A modular information handling system may comprise, for example, a chassis (e.g., a housing, an enclosure), at least one bay defined by the chassis, a bay wall or the chassis and a bay wall and having a pair of openings positioned at substantially opposing ends, wherein each bay is configured to receive a blade. A system may further comprise a conditional obturator in each bay and/or at least one blade positioned in one of the at least one bays, each blade comprising a processor, a memory communicatively coupled to the processor, and a local storage resource communicatively coupled to the processor. In some embodiments, each obturator may be configured to be automatically positioned (e.g., repositioned) to occupy substantially all of at least one of the pair openings when a blade is absent from the respective bay and positioned (e.g., repositioned) to automatically expose substantially all of the pair of the openings when a blade is present in the respective bay. In some embodiments, an obturator may comprise (a) a first hinge attached to the chassis and/or the bay wall, (b) a first door attached to the first hinge and spanning at least portion of the bay, (c) a second hinge attached to the chassis and/or the bay wall, and (d) a second door attached to the second hinge and spanning at least a portion of the bay, according to some embodiments. A door (e.g., the first door and/or the second door) may comprise an edge distal to a hinge e.g., the first hinge and/or the second hinge, respectively). In some embodiments, a first door edge and a second door edge may be operable to contact each other in the absence of a blade. An obturator, according to some embodiments, may comprise a spring configured to apply force tending to close the respective obturator door in the absence of a blade. An obturator may comprise a butterfly hinge and at least two doors, each door rotatably attached to the butterfly hinge, in some embodiments.

The present disclosure also relates to methods for reducing or eliminating air recirculation in a modular information handling system. For example, a method may comprise providing a modular information handling system comprising: n bays, each bay having two openings spaced apart from each other forming an air flow path through each bay, wherein n is an integer greater than or equal to 2, up to n−1 heat-releasing elements occupying up to n−1 of the n bays leaving at least one of the n bays unoccupied by one of the heat-releasing elements, and at least one obturator adjacent the air flow path of at least one of the n bays, the at least one obturator configured to automatically open or impede the flow path of the adjacent bays when the adjacent bay is or is not occupied by a heat-releasing element, respectively. A method may further comprise moving air into the modular information handling system, through the flow path of at least one of the up to n−1 occupied bays to form warmed air without moving air through the flow path of the at least one unoccupied bay and/or exhausting at least a portion of the warmed air. In some embodiments, moving air into the modular information handling system may further comprise drawing air into the modular information handling system using a fan in fluid communication with the flow path of at least one of the up to n−1 occupied bays. A method may further comprise inserting at least one additional heat-releasing element into at least one of the unoccupied bays to form a newly occupied bay, in some embodiments. Inserting at least one additional heat-releasing element may automatically open the flow path of the newly occupied bay. Opening the flow path of the newly occupied bay may comprise moving at least a portion of the adjacent obturator into previously unoccupied space between the heat-releasing elements. According to some embodiments, opening the flow path of the newly occupied bay may comprise contacting at least a portion of the at least one additional heat-releasing element with at least a portion of the adjacent obturator to ambulate the at least a portion of the adjacent obturator. A method may further comprise, in some embodiments, removing at least one of the heat-releasing elements from at least one of the occupied bays to form a newly unoccupied bay. Removing at least one of the heat-releasing elements may comprise automatically impeding the flow path of the newly unoccupied bay. In some embodiments, impeding the flow path of the newly unoccupied bay may comprise eliminating the flow path by completely blocking at least one of the two openings of the newly unoccupied bay.

The present disclosure further relates to methods for automatically adjusting air flow on the fly in a modular information handling system comprising a plurality of bays, each bay configured to receive a blade, at least partially defining a potential air flow path, and having an obturator configured to conditionally permit air flow through the bay. For example, a method may comprise passing coolant (e.g., ambient air) through at least one bay (e.g., up to all bays) occupied by a heat-releasing element (e.g., blade). In some embodiments, coolant may pass through the at least one bay occupied by a heat-releasing element without (e.g., substantially without, completely without) passing through unoccupied bays (e.g., some or all unoccupied bays). A method may further comprise, according to some embodiments, inserting a first heat-releasing element into an existing unoccupied bay to form a newly occupied bay and automatically repositioning at least a portion of the obturator to permit increased (e.g., increasing up to the maximum possible) air flow through the newly occupied bay. In some embodiments, a method may further comprise removing a second blade from an existing occupied bay to form a newly unoccupied bay and automatically repositioning at least a portion of the obturator to reduce (e.g., up to completely eliminate) air flow through the newly unoccupied bay.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such wires, optical fibers, microwaves, radio waves, and other electromagnetic and/or optical carriers; and/or any combination of the foregoing.

An information handling system may include or may be coupled via a network to one or more arrays of storage resources. The array of storage resources may include a plurality of storage resources, and may be operable to perform one or more input and/or output storage operations, and/or may be structured to provide redundancy. In operation, one or more storage resources disposed in an array of storage resources may appear to an operating system as a single logical storage unit or "logical unit."

In certain embodiments, an array of storage resources may be implemented as a Redundant Array of Independent Disks (also referred to as a Redundant Array of Inexpensive Disks or a RAID). RAID implementations may employ a number of techniques to provide for redundancy, including striping, mirroring, and/or parity checking. As known in the art, RAIDs may be implemented according to numerous RAID standards, including without limitation, RAID 0, RAID 1, RAID 0+1, RAID 3, RAID 4, RAID 5, RAID 6, RAID 01, RAID 03, RAID 10, RAID 30, RAID 50, RAID 51, RAID 53, RAID 60, RAID 100, etc.

The doors address the problem of airflow recirculation through a modular system that can occur as a result of a module being removed from the larger enclosure. This removal may result in cooling air moving along a path that is different from that which was designed to cool the system. This may lead to modules being starved of cooling air. Some embodiments of the disclosure may aid thermal regulation because no additional space is required for the implementation of the doors and/or no manual intervention is required on the part of the user.

In some embodiments of the disclosure a modular blade system, doors close to obstruct the flow of air through open module bays and open parallel to existing bay walls. When open, all components reside in unused space between blades occupied by bay walls and thus do not require any additional space for implementation.

According to some embodiments, operation of a door may require no intervention (e.g., no direct intervention) on the part of the user. A door may remain closed until a module is inserted into the bay. As the module is inserted, it may contact the door and push it into an open position. When the module is removed, the door closes behind the module (e.g., with the help of a spring).

In some embodiments, doors may be configured to work in pairs. For example, a pair of doors may be spring loaded against each other so no additional feature is needed in order to provide a rest for the spring.

Figure 1A:
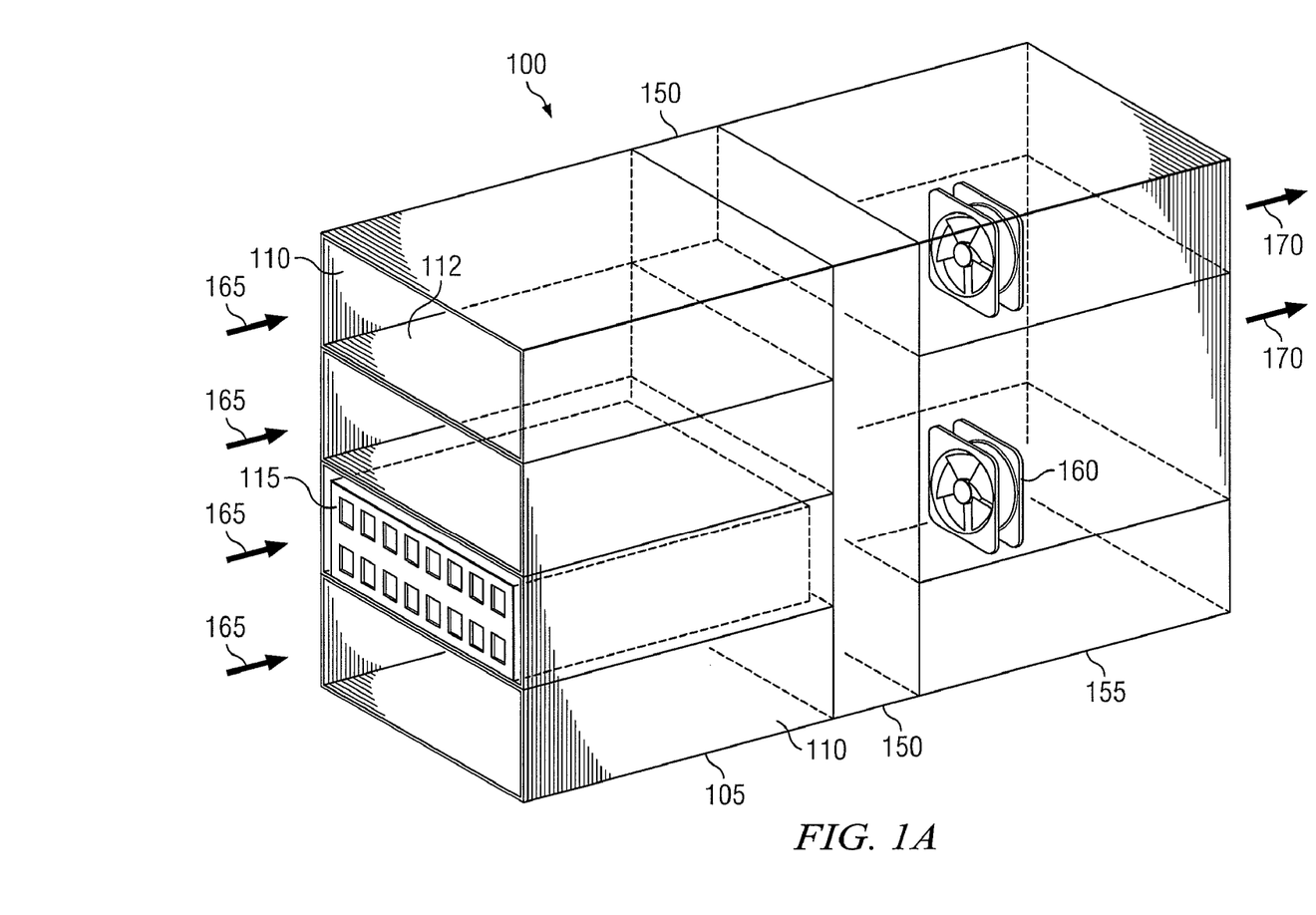
FIG. 1A is an isometric view of an example embodiment of a modular information handling system having four bays, one of which is occupied with a blade, in accordance with the present disclosure.

FIG. 1A illustrates an example embodiment of a modular information handling system configured to accept up to four blades and draw coolant (e.g., ambient air) across the blades, if present. As depicted in FIG. 1A, modular information handling system 100 may comprise chassis 105, bay 110, bay divider 112, blade 115, connector chassis 150, fan housing 155, and fan 160. In addition, a modular information handling system may include a power supply, a motor (e.g., a fan motor), a thermal controller, a processor, a memory communicatively coupled to the processor, and a local storage resource communicatively coupled to the processor (not expressly shown).

A thermal controller may be communicatively coupled to each bay (e.g., whether or not occupied by a blade), a power supply, and/or at least one fan. A thermal controller may be configured to receive and/or monitor the hardware configuration on each blade, the thermal condition created by software load on each blade (e.g., actual, theoretical, predicted), and the temperature of each blade. A thermal controller may be configured to activate one or more fans depending on each blade's specific cooling requirements. Each fan may be configured to move coolant (e.g., ambient air 165) into contact with one or more blades. In addition, each fan may be configured to move coolant that has been warmed by contact with a blade ("warmed coolant") away from the blade and out of the system (e.g., exhaust 170). Power consumption for thermal cooling may be undesirably high where coolant (e.g., ambient air) enters and/or passes through unoccupied bays and/or commingles with warmed coolant.

Figure 1B:
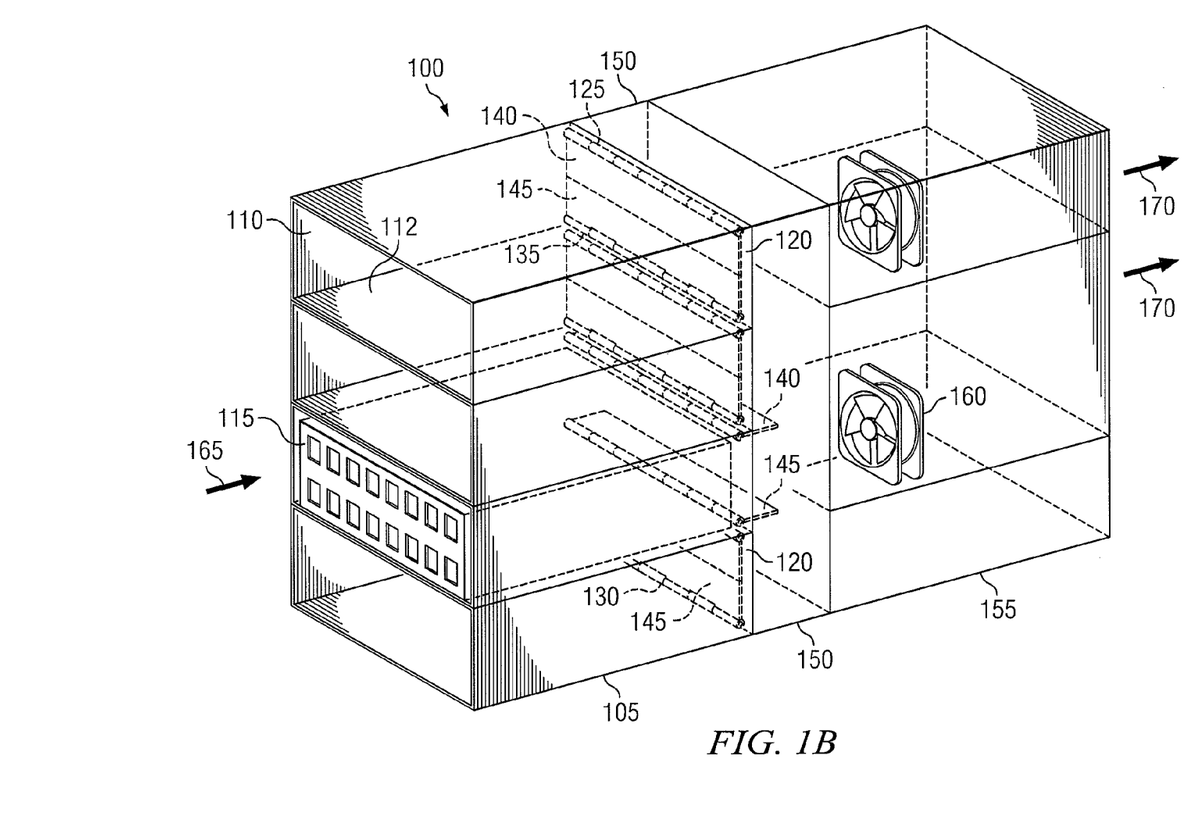
FIG. 1B is an isometric view of an example embodiment of a modular information handling system having four bays, one of which is occupied with a blade, in accordance with the present disclosure.

FIG. 1B illustrates an example embodiment of a modular information handling system configured to accept up to four blades and draw coolant (e.g., ambient air) across the blades, if present. As depicted in FIG. 1B, modular information handling system 100 may comprise chassis 105, bay 110, bay divider 112, blade 115, obturator 120, hinge 125, hinge 130, butterfly hinge 135, door 140, door 145, connector chassis 150, fan housing 155, and fan 160.

Each bay 110 is defined by chassis 105 and bay divider 112 and configured to receive a blade. For example, bay 110 may include a blade guide (not expressly shown) extending along the length of bay 110 parallel to the direction of blade insertion/removal. Each bay 110 has two openings, one on each end, and may define a fluid communication pathway between the exterior environment (e.g., shown to the left) and an annulus defined by connector chassis 150 (e.g., shown to the right).

Figure 1C:
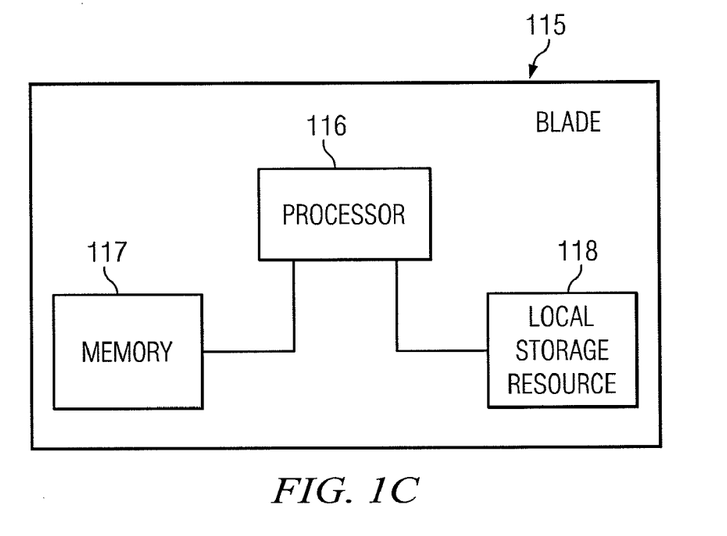
FIG. 1C is block diagram of a blade for use in a modular information handling system, in accordance with the present disclosure.

FIG. 1C illustrates a block diagram of an example embodiment of a blade for use in a modular information handling system. Each blade 115 may comprise, for example, a processor 116, a memory 117 communicatively coupled to the processor, and a local storage resource 118 communicatively coupled to the processor.

Each obturator 120 may comprise a hinge (e.g., hinge 125, hinge 130, and/or butterfly hinge 135) and/or a door (e.g., door 140 and/or door 145). For example, obturator 120 may comprise (a) hinge 125 and door 140, (b) hinge 130 and door 145, (c) hinge 125, door 140, hinge 130 and door 145, or (d) butterfly hinge 135, door 140, and door 145.

Hinge 125, hinge 130, and butterfly hinge 135 may be attached to any desirable surface, according to some embodiments. For example, uppermost hinge 125 is shown fixed to chassis 105, uppermost butterfly hinge 135 is shown fixed to bay divider 112, and lowermost hinge 130 is shown fixed to chassis 105.

Doors 140 and 145, as shown, are rotatably connected to their respective hinges. Doors 140 and 145 may comprise any rigid and/or semi-rigid material (e.g., thermoplastics such as polyurethane and/or acrylonitrile-butadiene-styrene) capable of maintaining its shape under positive pressure and/or negative pressure (e.g., applied by one or more fans). Doors 140 and/or 145 may be ambulated to a closed position (e.g., in the absence of a blade and/or upon removal of a blade) by a spring and/or a motor. When closed, doors 140 and 145 may occupy at least a portion of an adjacent opening in bay 110. For example, doors 140 and/or 145 may occupy a sufficient portion of an adjacent opening in bay 110 to form a barrier that reduces or eliminates fluid communication (e.g., actual or potential) through the respective bay 110.

Doors 140 and/or 145 may be ambulated to an open position (e.g., in the presence of a blade and/or upon insertion of a blade) by a spring, a motor, and/or the application of mechanical force by a blade upon the door during insertion. A spring or motor configured to open doors 140 and/or 145 may be activated manually by a user in some embodiments. A spring or motor configured to open doors 140 and/or 145, according to some embodiments, may be activated automatically, for example, by a pressure or motion sensor triggered by blade insertion. When in an open position, doors 140 and/or 145 may occupy little or none of an adjacent opening in bay 110. For example, doors 140 and/or 145 may occupy unused space along chassis 105, along bay divider 112, and/or in an annulus defined by connector chassis 150 and, thereby, leave fluid communication (e.g., actual or potential) through bay 110 unimpeded (e.g., substantially unimpeded).

Connector chassis 150 defines an annulus that is in fluid communication with fan 160 and at least one unoccupied bay 110, in which the respective obturator 120 is in an open position. In some embodiments, connector chassis 150 may be contiguous with chassis 105 and/or fan housing 155.

Fan housing 155, as shown, partially encloses two fan modules, each having a fan 160. Each fan 160 is in fluid communication with the annulus defined by connector chassis 150 (shown to the left) and the external environment (shown to the right). Each fan 160 is configured to draw gas (e.g., warmed coolant and/or ambient air) through at least a portion of its fan module and exhaust the gas to the exterior environment. While not expressly shown, fan modules may be configured to be hot swappable.

Figure 2A:
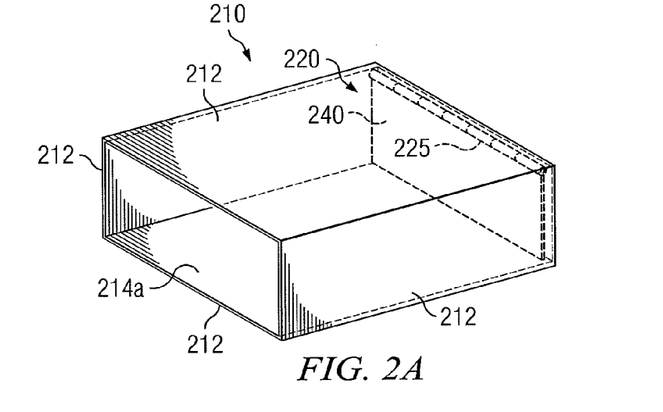
FIG. 2A is an isometric view of an example embodiment of a bay of a modular information handling system having an obturator in a closed position, in accordance with the present disclosure.
Figure 2B:
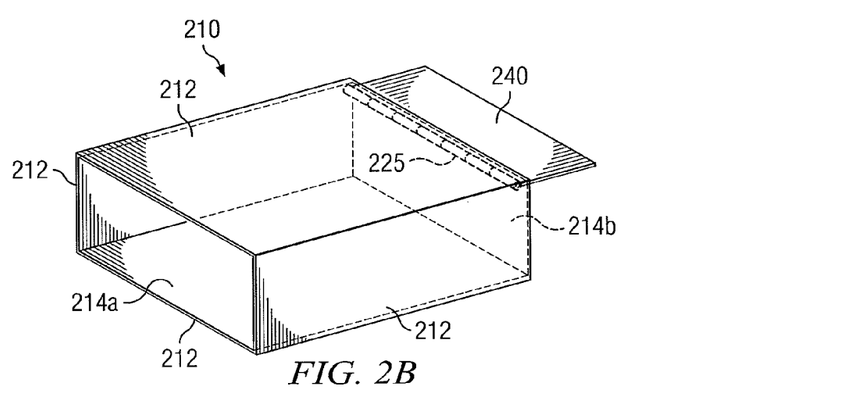
FIG. 2B is an isometric view of an example embodiment of a bay of a modular information handling system having an obturator in an open position, in accordance with the present disclosure.

FIGS. 2A and 2B illustrate an example embodiment of an individual bay of a modular information handling system configured to impede the flow of air when the bay is unoccupied. As depicted, bay 210 is configured to receive a single blade and comprises bay walls 212, apertures 214a and 214b, and obturator 220. Each bay wall 212 may be contiguous with chassis (e.g., chassis 105). Obturator 220, as shown, comprises hinge 225 and door 240. When a blade is absent and obturator 220 is in a closed position, door 240 occupies (e.g., blocks, covers, fills) substantially all of aperture 214b (FIG. 2A). When a blade is present and obturator 220 is in an open position, aperture 214b is substantially free of door 240 (FIG. 2B; blade omitted for clarity). For example, at least a portion of a blade may contact at least a portion of obturator 220 upon insertion and ambulate door 240. When obturator 220 is in an open position, bay 220 may define a fluid communication pathway.

Figure 2C:
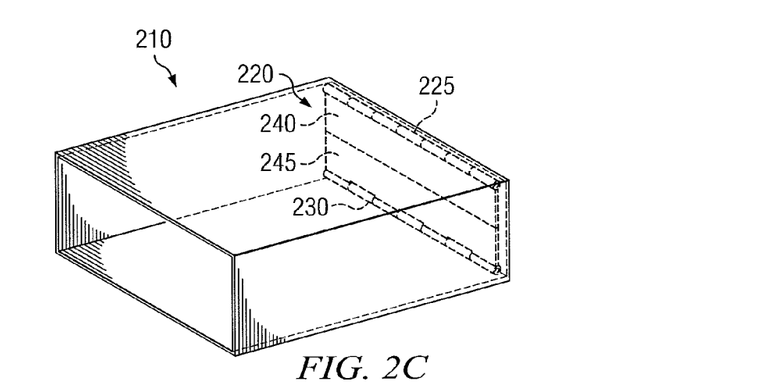
FIG. 2C is an isometric view of an example embodiment of a bay of a modular information handling system having an obturator in a closed position, in accordance with the present disclosure.
Figure 2D:
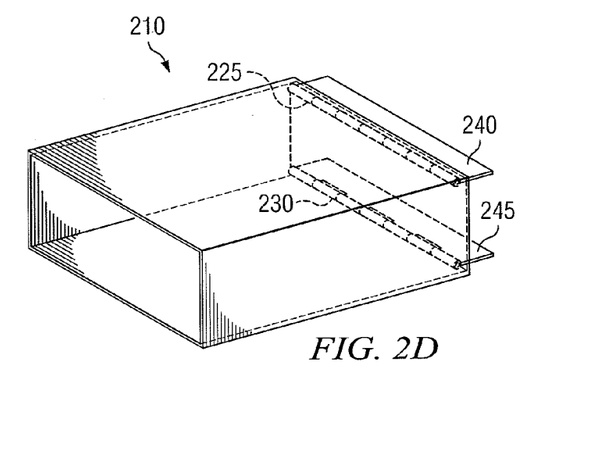
FIG. 2D is an isometric view of an example embodiment of a bay of a modular information handling system having an obturator in an open position, in accordance with the present disclosure.

FIGS. 2C and 2D illustrate an example embodiment of an individual bay of a modular information handling system configured to impede the flow of air when the bay is less than fully unoccupied by blades. As depicted, bay 210 is configured to receive two blades and comprises bay walls 212, apertures 214a and 214b, and obturator 220. Each bay wall 212 may be contiguous with chassis (e.g., chassis 105). Obturator 220, as shown, is positioned at the end of bay 210 and comprises hinge 225, door 240, hinge 230, and door 245. When blades are absent and obturator 220 is in a closed position, door 240 and door 245 together occupy (e.g., block, obstruct, cover, fill) substantially all of aperture 214b (FIG. 2C). When blades are present and obturator 220 is in a fully open position, aperture 214b is substantially free of doors 240 and 245 (FIG. 2D; blades omitted for clarity). For example, at least a portion of a blade may contact at least a portion of obturator 220 upon insertion and ambulate door 240 and/or door 245. When obturator 220 is in an open position, bay 220 may define a fluid communication pathway. Doors 240 and 245 may open and close independently and/or in tandem.

Doors 240 and 245 may be ambulated manually (e.g., upon insertion of a blade) and/or automatically (e.g., by one or more motors). For example, upon insertion, a blade may contact obturator 220 and manually force doors 240 and 245 into the open position. Doors 240 and 245 may be spring loaded to keep them in a closed position when bay 210 is less than fully occupied by blades. According to some embodiments, doors 240 and 245 may be ambulated by one or more operably linked motors. For example, upon activation (e.g., by the press of a button or touchscreen or activation of a motion or contact sensor) a motor may move doors 240 and/or 245 into an open position.

Figure 2E:
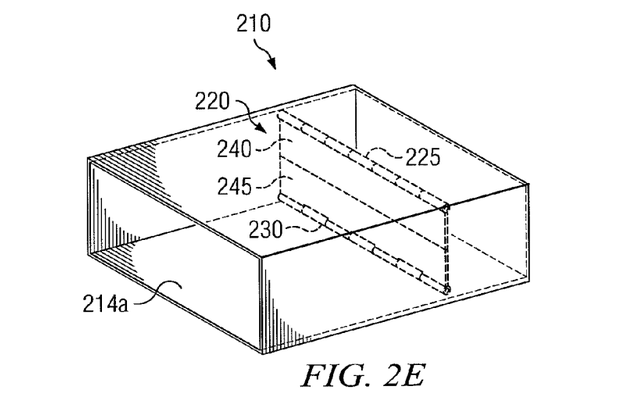
FIG. 2E is an isometric view of an example embodiment of a bay of a modular information handling system having an obturator in a closed position, in accordance with the present disclosure.
Figure 2F:
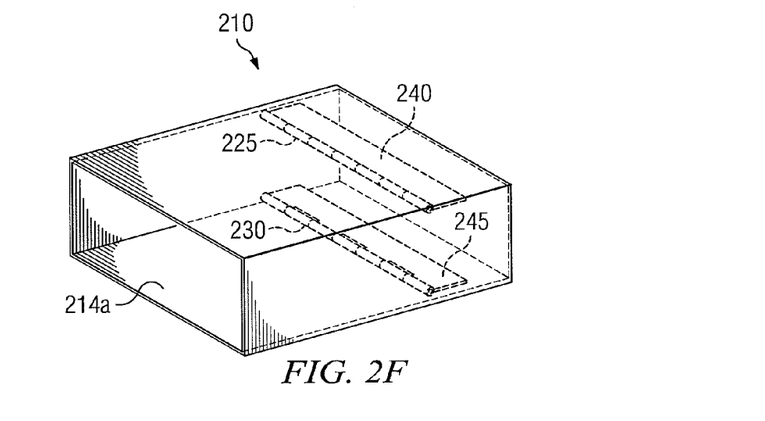
FIG. 2F is an isometric view of an example embodiment of a bay of a modular information handling system having an obturator in an open position, in accordance with the present disclosure.

FIGS. 2E and 2F illustrate an example embodiment of an individual bay of a modular information handling system configured to impede the flow of air when the bay is less than fully unoccupied by blades. As depicted, bay 210 is configured to receive two blades and comprises bay walls 212, apertures 214a and 214b, and obturator 220. Each bay wall 212 may be contiguous with chassis (e.g., chassis 105). Obturator 220, as shown, is positioned near the end of bay 210 and comprises hinge 225, door 240, hinge 230, and door 245. When blades are absent and obturator 220 is in a closed position, door 240 and door 245 together occupy (e.g., block, cover, fill) substantially all of the space defined by the interior perimeter of walls 212 (FIG. 2E).

When blades are present and obturator 220 is in a fully open position, aperture 214b is substantially free of doors 240 and 245 (FIG. 2F; blades omitted for clarity). While in the open position, doors 240 and 245 may touch interior walls 212 of bay 200 in some embodiments. Doors 240 and 245, for example, may be substantially coplanar with the adjacent interior wall 212 when bay 220 is occupied by a blade. At least a portion of a blade may contact at least a portion of obturator 220 upon insertion and ambulate door 240 and/or door 245. When obturator 220 is in an open position, bay 220 may define a fluid communication pathway.

Figure 3:
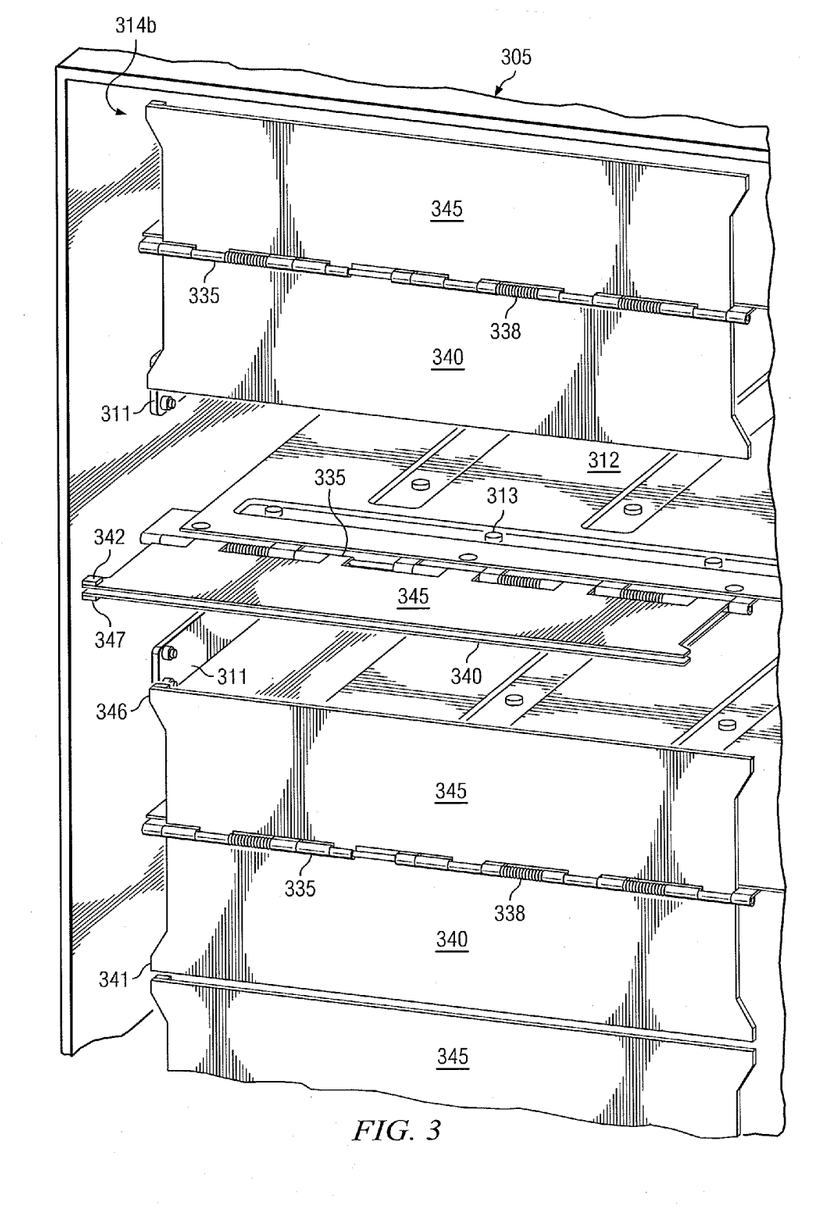
FIG. 3 is an isometric view of an example embodiment of a modular information handling system, in accordance with the present disclosure.

FIG. 3 is a reverse isometric view of a portion of an example embodiment of a modular information handling system. As depicted, modular information handling system comprises chassis 305, bays 310, and obturators 320. Each bay 310 is configured to receive two blades and comprises blade guides 311, bay walls 312, and aperture 314. Blade guides 311 are positioned along opposing lateral walls and facilitate smooth insertion and removal of blades from bay 310.

Each obturator 320 comprises butterfly hinge 335, door 340, and door 345 and is fixed to bay divider 312 through butterfly hinge 335. Specifically, fastener 313 secures hinge 335 to bay divider 312. As shown, hinge 335 comprises spring 338 positioned to apply force to doors 340 and 345 that tends to ambulate doors 340 and 345 towards blade guides 311. Each door 340 comprises flange 341, bumper pad 342, and distal edge 343. Each door 345 comprises flange 346, bumper pad 347, and distal edge 348. Bumper pads 342 and 347 are attached to flanges 341 and 346, respectively, and configured to contact at least a portion of blade guides 311. Distal edge 343 of door 340 is configured to contact distal edge 348 of door 345 of an adjacent obturator 320.

Figure 4A:
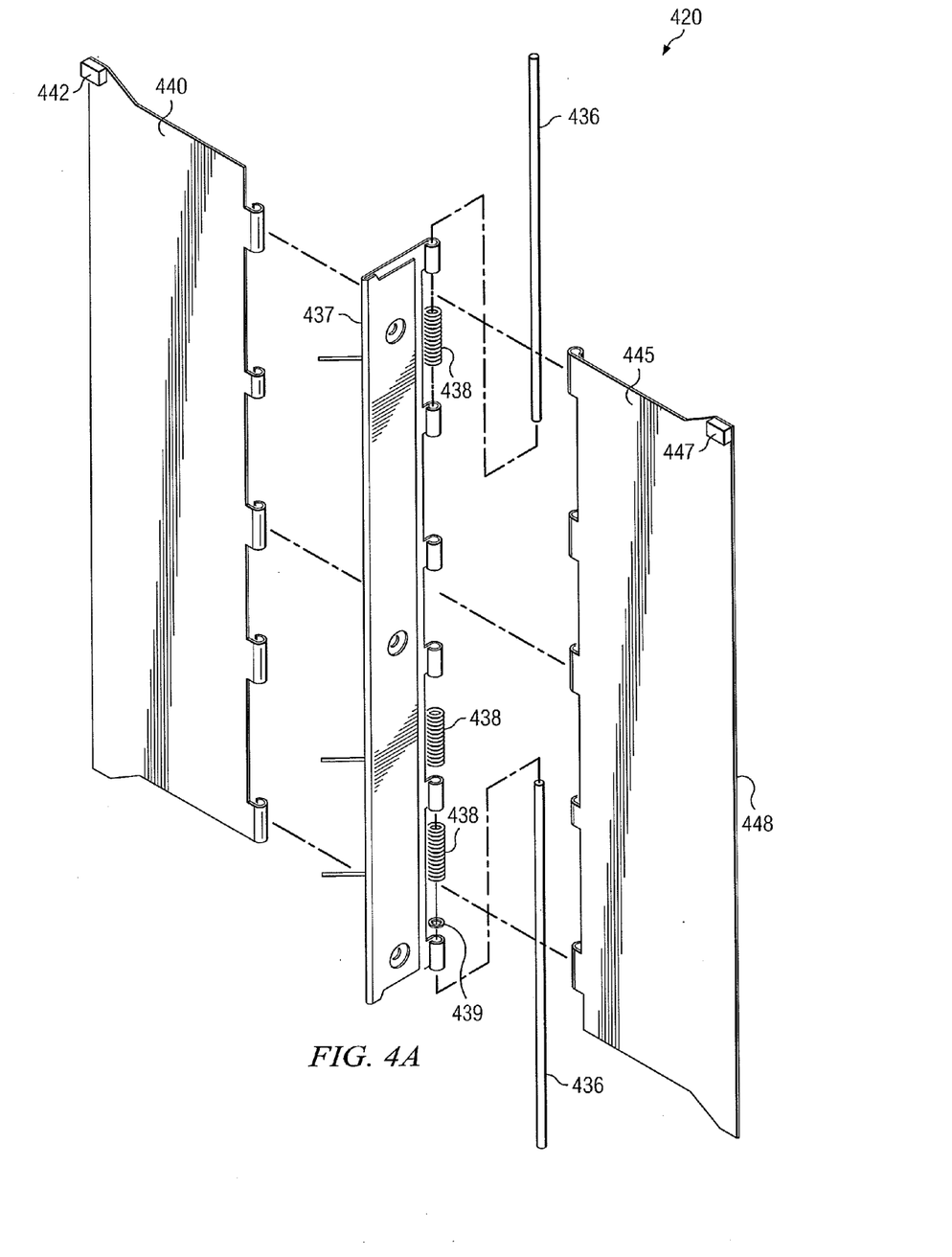
FIG. 4A is an isometric view of an example embodiment of an obturator assembly, in accordance with the present disclosure.
Figure 4B:
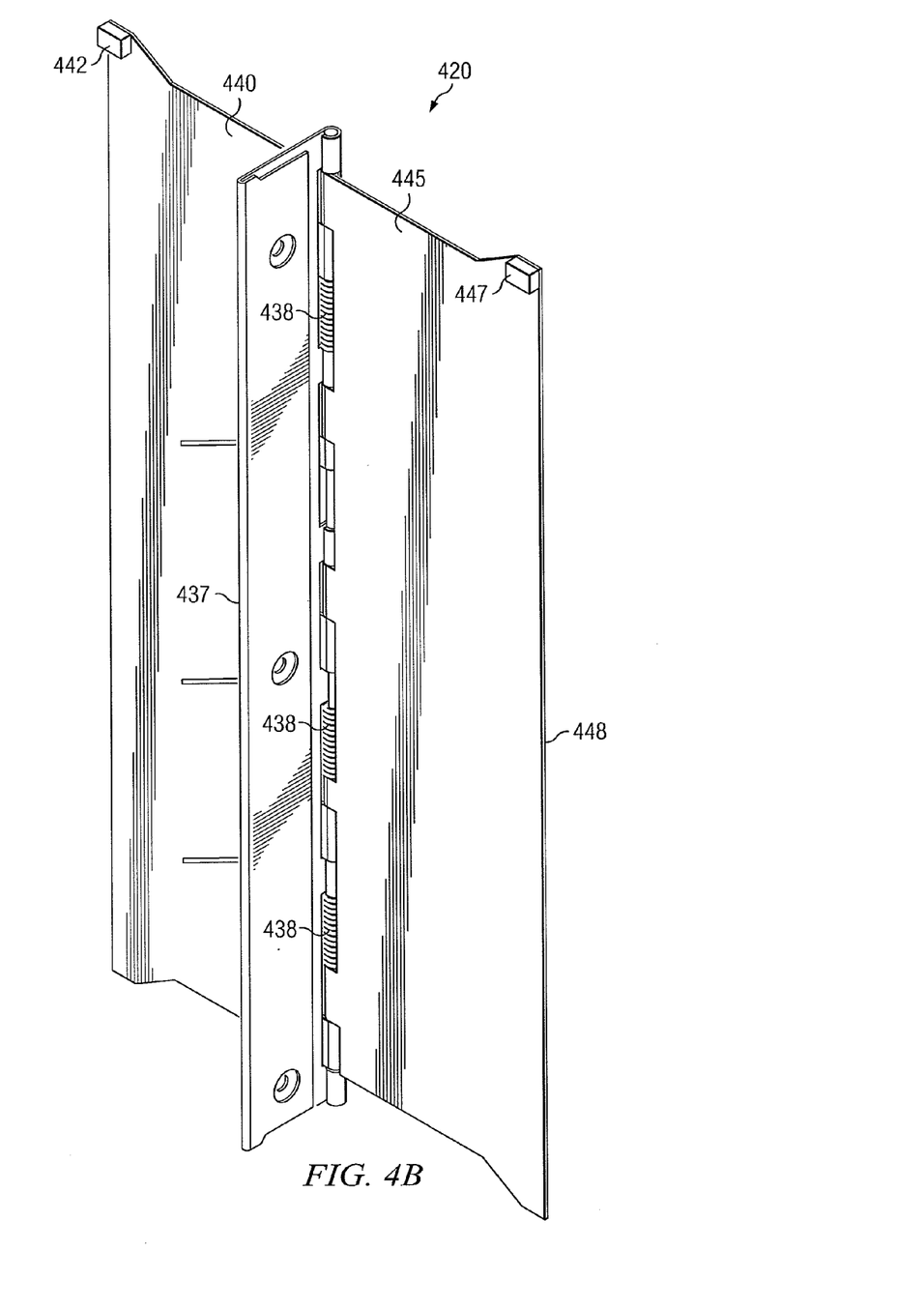
FIG. 4B is an isometric view of an example embodiment of an obturator assembly, in accordance with the present disclosure.
Figure 4C:
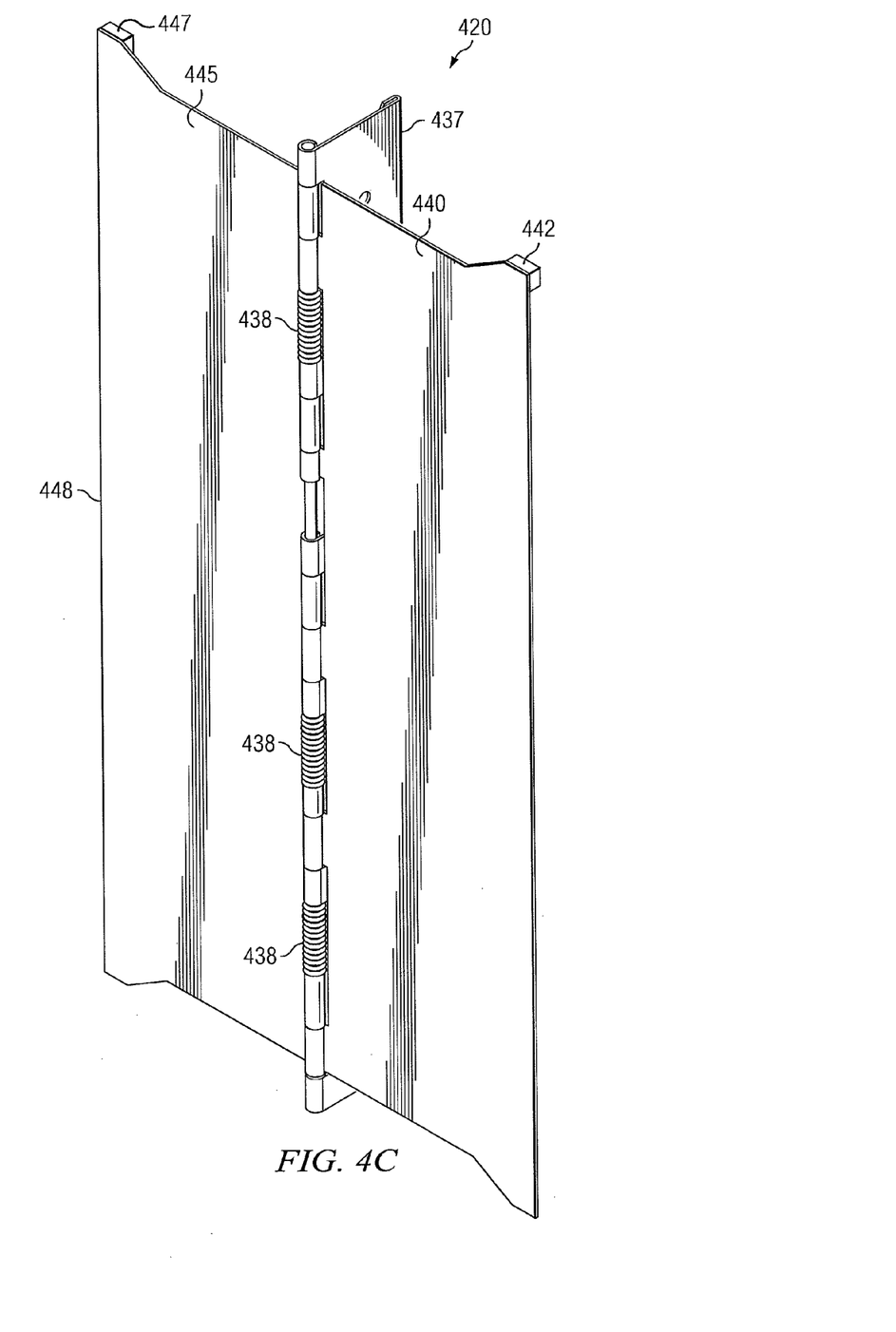
FIG. 4C is an isometric view of an example embodiment of an obturator assembly, in accordance with the present disclosure.

FIGS. 4A, 4B, and 4C illustrate an example embodiment of an obturator assembly for use in a modular information handling system. As depicted, obturator assembly 420 comprises butterfly hinge 435, door 440, and door 445.

Butterfly hinge 435 comprises pins 436a and 436b, hinge mount 437, springs 438, and washer 439. Assembly of obturator 420 may include inserting pin 436a through hinge mount 437, springs 438, washer 439, door 440, and door 445 pressing it into place. It may be desirable for knurled end of pin 436a to be flush with the end of hinge 435. Assembly of obturator 420 may include inserting pin 436b through hinge mount 437, springs 438, door 440, and door 445 pressing it into place. It may be desirable for knurled end of pin 436b to be flush with the end of hinge 435. Assembly of obturator 420 may include attaching bumper pads 442 and 447 to doors 440 and 445, respectively.

FIGS. 4B and 4C illustrate an assembled obturator 420. Springs 438 are oriented such that spring force is applied to the indicated surfaces of doors 440 and 445 (FIG. 4C).

Figure 5:
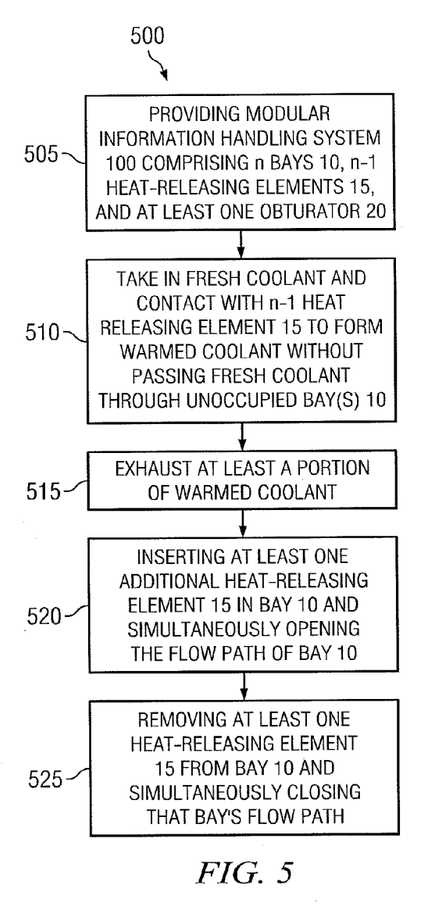
FIG. 5 is a block diagram illustrating an example embodiment of a method of reducing or eliminating air recirculation in a modular information handling system.

FIG. 5 illustrates an example embodiment of a method of reducing or eliminating air recirculation in a modular information handling system. According to one embodiment, method 500 begins at step 505. As noted above, teachings of the present disclosure may be implemented in a variety of configurations of system 100. As such, the preferred initialization point for method 500 and the order of the steps 505-525 comprising method 500 may depend on the implementation chosen.

At step 505, modular information handling system 100 is provided, which comprises:

n bays 10, each bay 10 having two openings 14 spaced apart from each other forming an air flow path through each bay 10, wherein n is an integer greater than or equal to 2, up to n−1 heat-releasing elements 15 (e.g., blades) occupying up to n−1 of the n bays 10 leaving at least one of the n bays 10 unoccupied by one of the heat-releasing elements 15, at least one obturator 20 adjacent the air flow path of at least one of the n bays 10, the at least one obturator 20 configured to automatically open or impede the flow path of the adjacent bays 10 when the adjacent bay 10 is or is not occupied, respectively, by a heat-releasing element 15.

At step 510, modular information handling system 0 takes in (e.g., using fan 60) a coolant gas (e.g., ambient air 165), passes at least a portion of the coolant gas through the flow path of at least one of the up to n−1 occupied bays 10 to form warmed coolant without passing coolant through the flow path of at least one unoccupied bay.

At step 515, modular information handling system 100 exhausts at least a portion of the warmed air (e.g., as exhaust 70).

At step 520, at least one additional heat-releasing element 15 is inserted into at least one of the unoccupied bays 10 to form a newly occupied bay 10, automatically opening the flow path of the newly occupied bay (e.g., by moving at least a portion of the adjacent obturator 20 into previously unoccupied space between the heat-releasing elements 15).

At step 525, at least one of the heat-releasing elements 15 from at least one of the occupied bays is removed to form a newly unoccupied bay 10, automatically impeding (e.g., up to completely closing) the flow path of the newly occupied bay 10 (e.g., by moving at least a portion of the adjacent obturator 20 into one of the openings 14 in adjacent bay 10.

Although FIG. 5 discloses a particular number of steps to be taken with respect to method 500, method 500 may be executed with greater or lesser steps than those depicted in FIG. 5. In addition, although FIG. 5 discloses a certain order of steps to be taken with respect to method 500, the steps comprising method 500 may be completed simultaneously and/or in any suitable order. Method 500 may be implemented using system 100 or any other system operable to implement method 500. In certain embodiments, method 500 may be implemented partially or fully in software embodied in computer-readable media.

Figure 6:
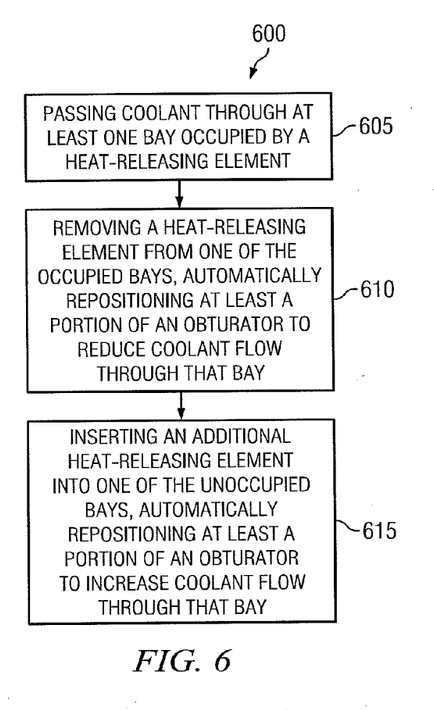
FIG. 6 is a block diagram illustrating an example embodiment of a method of reducing or eliminating air recirculation in a modular information handling system.

FIG. 6 illustrates an example embodiment of a method of automatically adjusting air flow on the fly in a modular information handling system comprising a plurality of bays, each bay configured to receive a blade, at least partially defining a potential air flow path, and having an obturator configured to conditionally permit air flow through the bay. According to one embodiment, method 600 begins at step 605. As noted above, teachings of the present disclosure may be implemented in a variety of configurations of system 100. As such, the preferred initialization point for method 600 and the order of the steps 605-615 comprising method 600 may depend on the implementation chosen.

At step 605, coolant (e.g., ambient air 165) passes through at least one bay 10 (e.g., up to all bays 10) occupied by a heat-releasing element (e.g., blade 15). In some embodiments, coolant may pass through the at least one bay 10 occupied by a heat-releasing element without (e.g., substantially without) passing through any bay 10 unoccupied by a heat-releasing element.

At step 610, one of the heat-releasing elements (e.g., blade 15) is removed from an existing occupied bay to form a newly unoccupied bay, automatically repositioning at least a portion of obturator 20 (e.g., door 40) to reduce (e.g., up to completely eliminate) coolant (e.g., ambient air 165) flow through the newly unoccupied bay.

At step 615, an additional heat-releasing element (e.g., blade 15) is inserted into an existing unoccupied bay to form a newly occupied bay, automatically repositioning at least a portion of obturator 20 (e.g., door 40) to permit increased (e.g., up to the maximum possible) coolant (e.g., ambient air 165) flow through the newly occupied bay.

Although FIG. 6 discloses a particular number of steps to be taken with respect to method 600, method 600 may be executed with greater or lesser steps than those depicted in FIG. 5. In addition, although FIG. 5 discloses a certain order of steps to be taken with respect to method 600, the steps comprising method 600 may be completed simultaneously and/or in any suitable order. Method 600 may be implemented using system 100 or any other system operable to implement method 600. In certain embodiments, method 600 may be implemented partially or fully in software embodied in computer-readable media.

Although the present disclosure has been described in detail, it should be understood that various changes, substitutions, and alterations can be made hereto without departing from the spirit and the scope of the disclosure as defined by the appended claims.

What is claimed is:

1. An information handling system comprising:
   a chassis;
   a fan in fluid communication with the chassis and configured to facilitate coolant flow through at least a portion of the chassis;
   a plurality of blades, each blade comprising:
      a processor;
      a memory communicatively coupled to the processor; and
      a local storage resource communicatively coupled to the processor;
   a plurality of bays associated with the chassis, wherein each bay is at least partially defined by a bay wall and is configured to receive a blade of the plurality of blades; and
   a plurality of obturators, each obturator coupled to a corresponding bay of the plurality of bays at an end nearest the fan and configured to:
      permit coolant flow to the fan through the corresponding bay if the corresponding bay includes the blade;
      substantially block coolant flow to the fan through the corresponding bay if the corresponding bay does not include the blade; and
   a thermal controller communicatively coupled to the plurality of bays, the thermal controller configured to activate the fan based on cooling requirements associated with the plurality of blades.

2. An information handling system according to claim 1, wherein each obturator further comprises:
   (a) at least one hinge coupled to at least one of the chassis and the bay wall; and
   (b) a door attached to the at least one hinge and spanning at least a portion of the corresponding bay.

3. An information handling system according to claim 1, wherein each obturator further comprises:
   (a) a first hinge coupled to at least one of the chassis and the bay wall;
   (b) a first door coupled to the first hinge and spanning at least portion of the corresponding bay;
   (c) a second hinge coupled to at least one of the chassis and the bay wall; and
   (d) a second door coupled to the second hinge and spanning at least a portion of the corresponding bay.

4. An information handling system according to claim 3, wherein the first door comprises an edge distal to the first hinge, the second door comprises an edge distal to the second hinge, and the first door edge and the second door edge are operable to contact each other in the absence of the blade.

5. An information handling system according to claim 3, wherein each obturator further comprises a spring configured to apply a force to close at least one of the first door or the second door in the absence of the blade.

6. An information handling system according to claim 1, wherein each obturator further comprises a butterfly hinge and at least two doors, each door rotatably coupled to the butterfly hinge.

7. An information handling system comprising:
   a chassis;
   a plurality of blades, each blade comprising:
      a processor;
      a memory communicatively coupled to the processor; and
      a local storage resource communicatively coupled to the processor;
   a plurality of bays associated with the chassis, wherein each bay is at least partially defined by a bay wall having a pair of openings positioned at substantially opposing ends and is configured to receive a blade of the plurality of blades;
   a plurality of obturators, each obturator coupled to a corresponding bay of the plurality of bays at an end nearest a fan and configured to:
      automatically reposition to occupy substantially all of at least one of the pair of openings when the blade is absent from the corresponding bay in order to substantially block air flow through the corresponding bay; and
      automatically reposition to expose substantially all of the pair of openings when the blade is present in the corresponding bay in order to permit air flow through the corresponding bay; and
   a thermal controller communicatively coupled to the plurality of bays, the thermal controller configured to activate the fan based on cooling requirements associated with the plurality of blades.

8. An information handling system according to claim 7, wherein each obturator comprises:
   a first hinge coupled to at least one of the chassis and the bay wall;
   a first door coupled to the first hinge and spanning at least a portion of one of the pair of openings in the corresponding bay in the absence of the blade;
   a second hinge coupled to at least one of the chassis and the bay wall;
   a second door coupled to the second hinge and spanning at least a portion of one of the pair of openings in the corresponding bay in the absence of the blade.

9. An information handling system according to claim 8, wherein the first door comprises an edge distal to the first hinge, the second door comprises an edge distal to the second hinge, and the first door edge and the second door edge are operable to contact each other in the absence of the blade.

10. An information handling system according to claim 8, wherein each obturator further comprises a spring configured to apply a force to close at least one of the first door or the second door in the absence of the blade.

11. An information handling system according to claim 7, wherein each obturator further comprises a butterfly hinge and at least two doors, each door rotatably coupled to the butterfly hinge.

12. A method of reducing or eliminating air recirculation in an information handling system, the method comprising:
- determining whether at least one bay of a plurality of bays associated with a chassis includes a heat-releasing element;
- closing a corresponding obturator associated with the at least one bay to substantially block coolant flow to a fan in fluid communication with the chassis through the at least one bay if the at least one bay does not include the heat-releasing element, the corresponding obturator coupled to the at least one bay at an end nearest the fan;
- opening a corresponding obturator associated with the at least one bay to permit coolant flow to the fan through the at least one bay if the at least one bay includes the heat-releasing element; and
- activating a thermal controller communicatively coupled to the plurality of bays based on cooling requirements associated with the plurality of blades.

13. A method according to claim 12 further comprising inserting at least one additional heat-releasing element into an unoccupied bay of the plurality of bays to form a newly occupied bay.

14. A method according to claim 13, wherein the inserting at least one additional heat-releasing element into an unoccupied bay further comprises automatically permitting coolant flow to the fan through the newly occupied bay.

15. A method according to claim 14, wherein the permitting coolant flow to the fan through the newly occupied bay comprises moving at least a portion of an obturator of the newly occupied bay into a previously unoccupied space.

16. A method according to claim 14, wherein the permitting coolant flow to the fan through the newly occupied bay comprises contacting at least a portion of the obturator of the newly occupied bay with at least a portion of the at least one additional heat-releasing element to ambulate the obturator of the newly occupied bay.

17. A method according to claim 12 further comprising removing the heat-releasing element from an occupied bay of the plurality of bays to form a newly unoccupied bay.

18. A method according to claim 17, wherein the removing the heat-releasing element from the occupied bay further comprises automatically blocking coolant flow to the fan through the newly unoccupied bay.

19. A method according to claim 18, wherein the automatically blocking coolant flow to the fan through the newly unoccupied bay comprises completely blocking at least one of two openings of the newly unoccupied bay.

* * * * *